(12) United States Patent
Belluomini et al.

(10) Patent No.: US 7,282,960 B2
(45) Date of Patent: Oct. 16, 2007

(54) DYNAMIC LOGICAL CIRCUIT HAVING A PRE-CHARGE ELEMENT SEPARATELY CONTROLLED BY A VOLTAGE-ASYMMETRIC CLOCK

(75) Inventors: Wendy Ann Belluomini, Austin, TX (US); Robert Kevin Montoye, Austin, TX (US); Aniket Mukul Saha, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 11/168,718

(22) Filed: Jun. 28, 2005

(65) Prior Publication Data

US 2006/0290385 A1 Dec. 28, 2006

(51) Int. Cl.
| | |
|---|---|
| *H03K 19/20* | (2006.01) |
| *H03K 19/094* | (2006.01) |
| *H03K 19/0175* | (2006.01) |
| *H03K 19/096* | (2006.01) |

(52) U.S. Cl. ............... 326/121; 326/81; 326/86; 326/87; 326/95; 326/96; 326/97; 326/98; 326/112; 326/119

(58) Field of Classification Search ............ 326/83–90, 326/112, 119, 121
See application file for complete search history.

(56) References Cited

U.S. PATENT DOCUMENTS

| | | | | |
|---|---|---|---|---|
| 5,764,089 A | * | 6/1998 | Partovi et al. ............... | 327/200 |
| 5,796,282 A | | 8/1998 | Sprague et al. | |
| 6,040,716 A | * | 3/2000 | Bosshart ..................... | 326/98 |
| 6,242,952 B1 | * | 6/2001 | Bosshart et al. ............... | 326/98 |
| 6,429,689 B1 | | 8/2002 | Allen et al. | |
| 6,433,587 B1 | * | 8/2002 | Assaderaghi et al. ......... | 326/95 |
| 6,650,145 B2 | | 11/2003 | Ngo et al. | |
| 6,707,318 B2 | * | 3/2004 | Kumar et al. ................. | 326/98 |
| 6,737,888 B1 | * | 5/2004 | Lattimore et al. ............ | 326/93 |
| 6,765,414 B2 | * | 7/2004 | Keshavarzi et al. .......... | 326/93 |
| 6,900,666 B2 | | 5/2005 | Kursun et al. | |
| 6,952,118 B2 | * | 10/2005 | Jamshidi et al. .............. | 326/98 |
| 6,956,406 B2 | * | 10/2005 | Seningen et al. ........... | 326/121 |
| 6,972,599 B2 | * | 12/2005 | Forbes ........................ | 326/97 |
| 7,109,757 B2 | * | 9/2006 | Yuan et al. ................... | 326/95 |
| 7,129,754 B2 | * | 10/2006 | Ngo et al. .................... | 326/97 |
| 7,164,293 B2 | * | 1/2007 | Ramaraju et al. ............ | 326/98 |
| 2003/0197530 A1 | * | 10/2003 | Tamura ....................... | 326/98 |

(Continued)

*Primary Examiner*—Vibol Tan
*Assistant Examiner*—Dylan White
(74) *Attorney, Agent, or Firm*—Mitch Harris, Atty at Law, LLC; Andrew M. Harris; Casimer K. Salys

(57) ABSTRACT

A dynamic logical circuit having a pre-charge element separately controlled by a voltage-asymmetric clock controlled provides increased noise immunity in dynamic digital circuits. By clocking the pre-charge element with a signal having a reduced swing in the voltage direction that turns off the pre-charge element, the pre-charge element provides a small current that prevents the dynamic summing node of a gate from erroneously evaluating due to noise, and eliminates the need for a keeper device. Providing the reduced-swing asymmetric clock as a separate signal prevents performance degradation in the rest of the circuit. Specifically, the foot devices in the dynamic portion of the circuit are controlled with the full swing clock so that evaluation is not compromised by noise or slowed. Foot and pull-up devices in any static portion of the circuit are also controlled with the full-swing clock so that switching speed and leakage immunity are not affected.

19 Claims, 3 Drawing Sheets

U.S. PATENT DOCUMENTS

| | | |
|---|---|---|
| 2004/0051556 A1* | 3/2004 | Shimazaki et al. ............ 326/80 |
| 2004/0164769 A1* | 8/2004 | Sung et al. .................... 326/98 |
| 2005/0134316 A1* | 6/2005 | Haller et al. .................. 326/95 |
| 2006/0082389 A1 | 4/2006 | Ngo et al. |
| 2006/0103431 A1 | 5/2006 | Ngo et al. |

* cited by examiner

DYNAMIC LOGICAL CIRCUIT HAVING A PRE-CHARGE ELEMENT SEPARATELY CONTROLLED BY A VOLTAGE-ASYMMETRIC CLOCK

This invention was made with Government support under H98230-04-C-0920 IVY Grant (Zebra task4). THE GOVERNMENT HAS CERTAIN RIGHTS IN THIS INVENTION.

CROSS-REFERENCE TO RELATED APPLICATION

The present application is related to co-pending U.S. patent application "METHOD AND APPARATUS FOR POWER CONSUMPTION REDUCTION IN A LIMITED-SWITCH DYNAMIC LOGIC (LSDL) CIRCUIT", Ser. No. 11/168,691, filed concurrently with this application, the applications having at least one common inventor and assigned to the same Assignee. The specification of the above-referenced application is incorporated herein by reference.

BACKGROUND OF THE INVENTION

1. Technical Field

The present invention relates generally to dynamic logic circuits, and more particularly to a dynamic logical circuit having improved noise tolerance by reducing the swing of the pre-charge element control clock.

2. Description of the Related Art

Dynamic logic circuits are well known in field of digital circuits. Dynamic logic is used to decrease device count and increase speed in large-scale circuits such as very-large-scale-integration (VLSI) circuits. Dynamic logic includes pure cascaded dynamic logic referred to as "domino" logic circuits as well as static/dynamic hybrid forms of logic such as limited-switch dynamic logic (LSDL). Dynamic logic performs evaluation and storage functions in microprocessors, memories and other digital devices.

Dynamic logic circuits operate in a two-phase manner: clock signals are used to pre-charge nodes in the circuits to known values, typically at or near one of the power supply rails. Then, when the pre-charge clock changes state, an evaluation is performed by discharging the pre-charged nodes with ladders or "trees" of transistors connected in parallel-series arrangement to the opposite power supply rail. In a typical gate, with an inverter coupling a summing node to the output and N-channel transistor ladders used to pull down the summing node from a logical high level pre-charge state, each ladder combines its inputs in a logical AND function (as all transistors in a ladder must be on for the ladder to pull down the summing node), while the parallel connected ladders are combined in a logical OR function, as any activated ladder will pull down the summing node, resulting in a logical high level at the output of the dynamic logic gate.

In certain topologies and particular gate arrangements, static logic can be combined with dynamic logic to reduce circuit size, increase speed or provide other topological benefits. One such architecture is the above-mentioned LSDL logic, which reduces circuit area below that of other competitive logic types such as domino logic, while still providing the ability to generate complementary logic outputs, via one or more static stages that receive the dynamic evaluation node as an input.

However, as transistor size and power supply voltages have decreased, leakage at the dynamic node has necessitated the introduction of keeper devices in dynamic logic gates so that leakage does not cause false evaluation, especially when leakage is combined with noise present on the logic inputs and charge-sharing effects in the input logic tree. The keeper devices generally take the form of half-latches or complementary inverter pairs that are used to hold the state of the dynamic node of the circuit until a strong evaluation current or the pre-charge state of the clock causes a change in the dynamic node.

The keeper devices not only add additional device area to a dynamic gate, but also increase the capacitance at the evaluation node, leading to an increase in device size or corresponding decrease in channel length in order to provide the same evaluation speed at the dynamic node.

Therefore, it would be desirable to provide a keeper-less dynamic logic gate with decreased sensitivity to dynamic node leakage and noise/charge-sharing effects in the input logic tree.

SUMMARY OF THE INVENTION

The objective of providing a keeper-less dynamic logic circuit having reduced sensitivity to leakage and noise/charge-sharing input effects is provided in a dynamic logic circuit and method of operating a dynamic logic circuit.

The dynamic logic circuit includes a dynamic logic input tree comprising one or more transistor ladders connected between a summing node and a power supply rail through a foot device. The gates of the transistors are connected to logical inputs that cause the summing node to evaluate for particular logical combinations of binary voltage states at the gates of the transistors. A pre-charge/hold device is connected between the summing node and the opposite power supply rail for precharging the summing node in response to a control signal and providing a "hold" current during an opposite state of the control signal.

The pre-charge/hold device control signal is a voltage-asymmetric reduced swing version of the clock signal that controls the foot device of the dynamic gate and any clocked foot/pull-up devices in the static portion of the dynamic logic circuit. The voltage of the control signal during the evaluate period of the clock signal is substantially closer to the midpoint of the power supply rail than the corresponding voltage of the clock signal, (generally at or below 90% of the power supply rail), which causes the pre-charge/hold device to source a small current during the evaluation period that counteracts leakage current and any false evaluate currents due to charge-sharing effects or noise in the input tree.

The summing node is connected to the input of an inverter or other output buffer that provides the output of the dynamic logic gate, and may include a static stage such as a limited switch dynamic logic (LSDL) output stage.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

Figure 1:
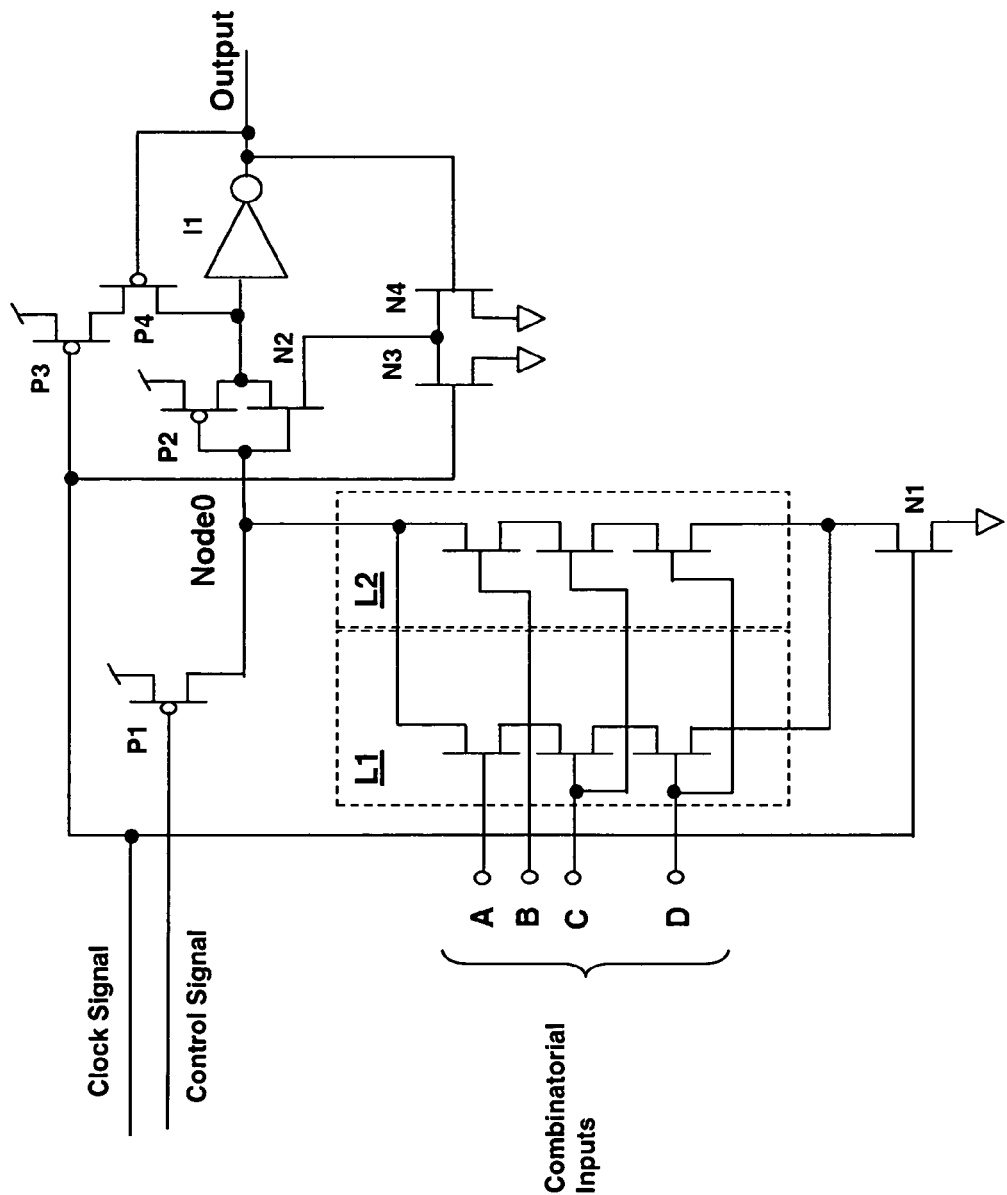
FIG. 1 is a schematic of a dynamic logic circuit in accordance with an embodiment of the invention.

The present invention concerns a mechanism for preventing certain effects in the input ladders of a dynamic logic gate from causing false evaluations at the summing node of the logic gate. Generally, the effects of present concern are noise on the logic inputs and to a lesser degree in the dynamic circuit itself, charge sharing effects in the transistors of the input logic ladders and leakage through the input ladders all of which can change the state of the output of the dynamic logic gate by altering the voltage on the summing node of the dynamic circuit when the input logic value combination dictates that the dynamic logic gate should not evaluate. The problem has been exacerbated as process sizes and power supply voltages shrink and various solutions have been proposed and implemented, the most common of which are the addition of keeper circuits that hold the state of the summing node at or near the pre-charge level unless a strong evaluation discharge is provided by one or more of the logic ladders in response to a logical input signal combination for which the summing node should properly be discharged. However, as mentioned above, the addition of the keeper circuits increases the capacitance of the node, requiring stronger devices for both pre-charge and evaluate functions. The keeper circuits also consume device area.

The present invention solves the above-mentioned problem of maintaining the state of the summing node in the pre-charge state and after the pre-charge interval (i.e., during the evaluation phase of the clock signal) by using the pre-charge circuit itself, generally a single, relatively small transistor that supplies current to the summing node from the power supply rail opposing the rail to which the input logic ladders are connected. Normally, the pre-charge device in conventional dynamic logic is controlled by the logic clock used to cascade data values through chains of dynamic logic circuits. However, the present invention separates the pre-charge signal that controls the pre-charge circuit from the clock signal that controls other functions of the dynamic logic gate, such as isolating portions of static portions of the logic gates in such dynamic/static structures such as limited-switch dynamic logic (LSDL).

The above-mentioned separated control signal is then given a different and asymmetrical voltage swing, but the same edge timing as the clock signal. During the pre-charge phase, the pre-charge device is turned fully on by setting the voltage state of the control signal to near or at the proper power supply rail for control (e.g., near ground for a PMOS pre-charge device pre-charging from a positive power supply rail). In the pre-charge phase, the control signal voltage and the clock signal voltage are substantially equal. However, during the evaluate phase, the control voltage is set to a voltage substantially away from the corresponding supply rail (and therefore substantially away from the clock signal voltage), so that the pre-charge transistor is permitted to conduct some current. By substantially away from the power supply rail or clock signal voltage, what is meant is that functionally, the voltage is substantially different so that the pre-charge device will conduct partially if there is current being drawn from the summing node, as in the case of leakage and momentary conduction due to noise or charge-sharing effects.

For example, a value between 10 and 20 percent of the power supply total voltage away from the corresponding supply rail (e.g., between 0.8 and 0.9V in the above PMOS example when the supply voltage $V_{dd}$ is at 1.0V). By carefully selecting the voltage of the pre-charge device gate during the evaluation phase, the leakage current can be compensated, and sufficient additional current capability can be provided to overcome any transients due to noise or momentary conduction due to charge-sharing memory from the previous state of the input ladder transistors.

With reference now to the figures, and in particular with reference to FIG. 1, there is depicted a schematic diagram of an LSDL gate embodying a method and an apparatus in accordance with the present invention. A dynamic portion of the dynamic logic gate is provided by ladders L1 and L2 coupled between a summing node Node0 and ground. Ladders L1 and L2 thus form an N-tree or "tree" of N-channel transistors and if either ladder L1 and L2 is activated during the evaluation phase of operation, summing node Node0 will be pulled low. A foot transistor N1 prevents shorting and/or discharging Node0 during the pre-charge phase of operation and a pre-charge transistor P1 pre-charges node Node0 to a high level. It should be understood that an a equivalent structure could be made with P-channel transistors in place of N-channel transistors and vice-versa as long as the power supply rail polarities and signal polarities are reversed. It should be noted that not all dynamic logic trees are made of independent ladders, for example, the transistors receiving input signals C and D could be merged and thus the current paths also merged, forming a more complex tree. The illustrated N-tree evaluates the equation A·C·D+B·C·D, where "+" is the logical-OR operator and "·" is the logical-AND operator. However, any combinatorial equation could be implemented by changing the N-tree and the invention encompasses all such logic.

Unlike typical LSDL or other dynamic logic gates, in the present invention pre-charge transistor P1 is not clocked by the clock signal that operates foot device N1 and other stages of the dynamic logic gate, but rather by a special control signal. Also, the control signal is not merely a delayed or timing-altered version of the clock signal voltage, but has a different voltage swing for controlling a current supplied during the evaluation phase as described above. Summing node Node0 is connected to an inverter formed by transistors P2 and N2, which provides an output to another inverter I1.

Inverter I1 provides the output of the dynamic logic gate, but alternatively or in concert, a complementary output can be taken from the input of inverter I1, as supplied by the inverter formed by transistors P2 and N2 in conjunction with other devices having behaviors as described in further detail below.

The inverter formed by transistors N2 and P2 is sink-disabled when both of transistors N3 and N4 are off. Transistor N3 is disabled during the pre-charge phase, which may be symmetric or asymmetric in time with respect to the evaluation phase. Therefore, the inverter formed by transistors N2 and P2 will only sink current from the input of inverter I1 if the output of inverter I1 is in a logical high state, causing that state to be held. Also during the pre-charge phase, transistor P3 is enabled, and transistor P4 which also controls the serially-connected pull-up chain formed by transistors P3 and P4, will be on if the output of inverter I1 is in a logical low state, causing that state to be held. Therefore, the pull-up chain formed by transistors P3 and P4 along with the sink portion (transistors N2-N4) of the inverter formed by transistors N2 and P2 perform a holding function, holding the value determined by the input of the inverter formed by transistors N2 and P2. The only non-hold function of the above-described circuit is provided by operation of the inverter formed by transistors N2 and P2, either through conduction of transistor P2, which can only occur when one of ladders L1, L2 has discharged summing node Node0 during an evaluation phase, or by conduction through transistor N2 during the evaluation phase when transistor N3 is enabled and summing node Node0 is in the pre-charge state. Thus the operation of transistors N2-N4 and P2-P4 is that of a static latch that latches the appropriate value at the input and output of inverter I1 after the evaluation phase has passed.

Figure 2:
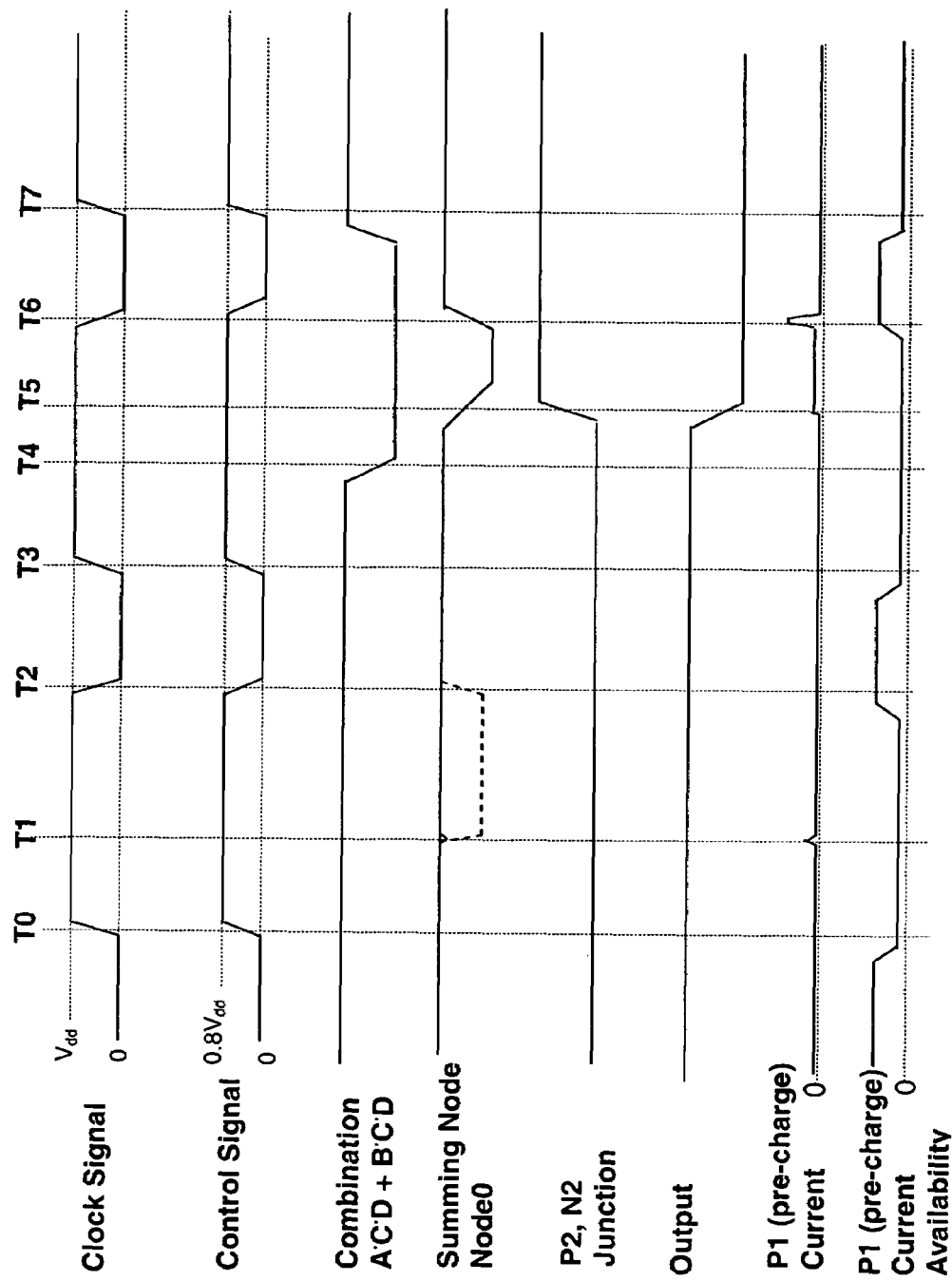
FIG. 2 is a signal diagram depicting the time-voltage relationship of signals within the dynamic logic circuit of FIG. 1.

Referring now to FIG. 2 the above-described operation is further detailed in a signal diagram depicting timing and voltage relationships of signals on various nodes of the circuit depicted in FIG. 1. At time T0 the logic gate is shown entering an evaluation phase after being in the pre-charge state. The voltage and timing relationships between the clock signal and the control signal are shown, with the control signal logic high state (pre-charge disabled) shown as 80 percent of the supply rail value as an example.

The bottom signal lines in the diagram show the availability of, and actual value of the pre-charge current, that is, the current through transistor P1. The availability of current from P1 is directly related to the control signal as shown. Normally, the only current drawn through P1 (actual pre-charge current) is current use to re-charge summing node Node0 at the next pre-charge phase after an evaluation has occurred. However, at time Ti a noise spike is shown on summing node Node0 that without the action of the present invention, would cause the summing node voltage to follow the dashed line. (The effects on other signals such as the output are not shown but should be understood from the operation of the circuit to follow an erroneous signal path.) A spike is also seen in the P1 current value at time T1, indicating that P1 has sourced current to keep summing node Node0 charged so that only a slight deviation occurs rather than the possible error illustrated by the dashed line. During the first evaluation period shown, the logical input signal combination yields a desired output of logical "1" from the dynamic logic gate.

At time T2, another pre-charge phase begins and the available current from P1 rises to the pre-charge current level. The actual current through transistor P1 is shown in the graph. The baseline value of the current through transistor P1 is the value of the leakage current leaving summing node Node0 (the sum of all currents at Node0 other than the current through transistor P1). At time T3, the pre-charge phase ends and another evaluation phase begins and at time T4 the input combination causes conduction of the logic tree, discharging summing node Node0 at time T5 causing a current to flow through transistor P1 (as limited by the voltage of the control signal) and causing the output(s) of the dynamic logic gate to change state. At time T6 the clock and control signals enter another pre-charge phase, and P1 conducts a strong pre-charge current to quickly restore summing node Node0 to the pre-charge condition. At time T7, another evaluation phase begins.

Figure 3:
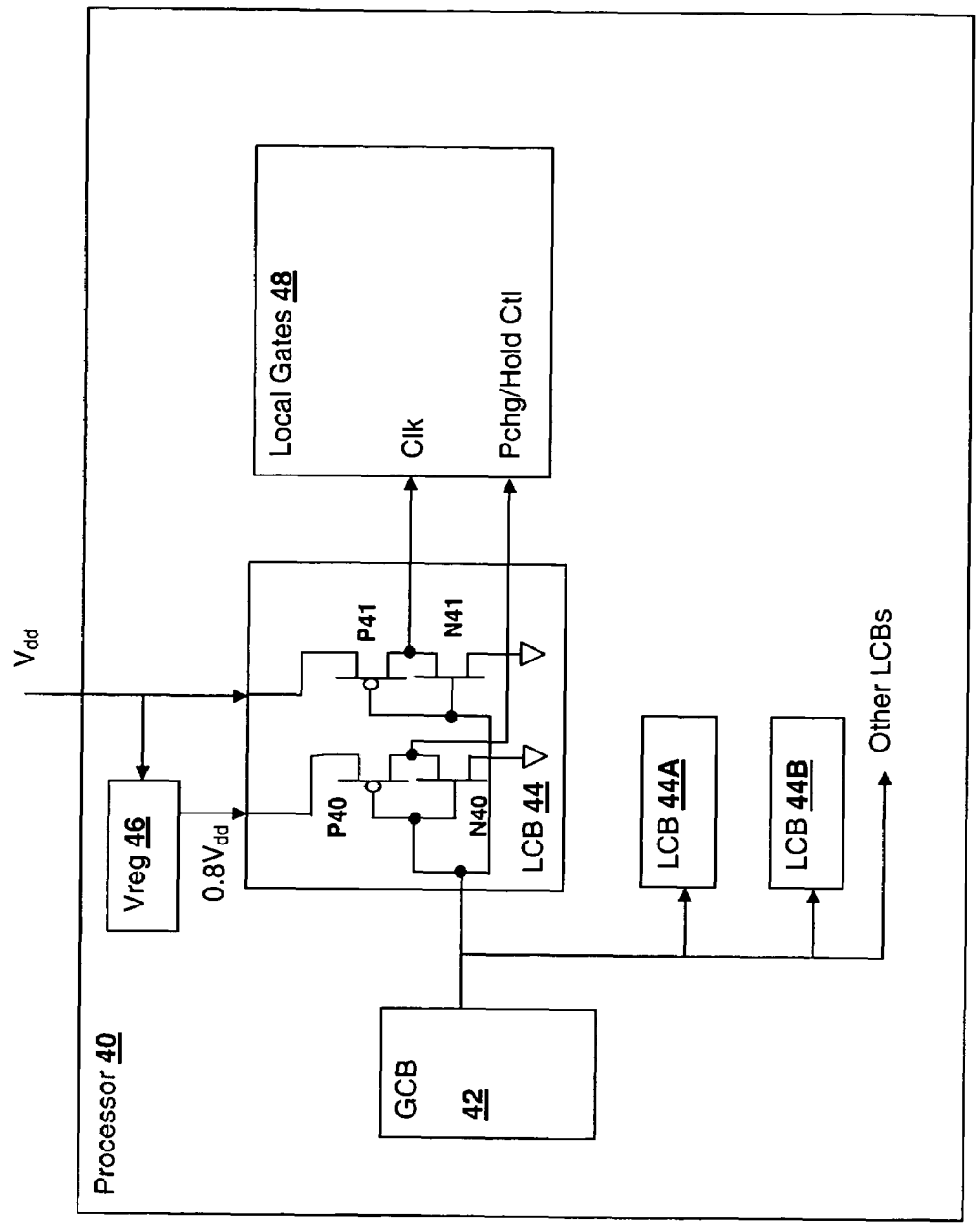
FIG. 3 is a schematic diagram depicting a specific clock/control signal distribution scheme in accordance with an embodiment of the present invention.

Referring now to FIG. 3, a clock/control signal distribution scheme is depicted in accordance with an embodiment of the present invention. A processor 40 is an example of a type of integrated circuit to which the techniques of the present invention apply, but it should be understood that the illustrated technique applies generally to any dynamic logic circuit for which large-scale clock distribution must be employed. A global clock buffer 42 receives the clock signal for the dynamic logic from other internal circuits (typically the output of a phase-lock-loop oscillator circuit) and the clock is distributed on global clock distribution lines to multiple local clock buffers 46, 46A and 46B. Local clock buffers 46, 46A and 46B generate both the clock signal and the control signal for the dynamic logic gates 48 of the present invention. A voltage regulator 46 can be implemented on-chip or an external voltage can be brought in to supply the upper rail of a buffer (inverter formed by transistors P40 and N40) that generates the control signal Pchg/hold while the full power supply $V_{dd}$ is used to supply the upper rail of a buffer (inverter formed by transistors P41 and N41) that generates the clock signal for local dynamic logic gates 48. The above-described scheme is not the only possible scheme (for example, global clock buffer 42 could distribute both a clock and a control signal), but represents a solution that minimizes skew between the signals by distributing a global reference, but does not require generation of the reduced voltage control signal at each gate, which is another possible solution.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A dynamic logic gate, comprising:
   a clock signal input for receiving a clock of said dynamic logic gate, said clock signal having a voltage swing between voltage states substantially equal to voltages of a first and second power supply rail of said dynamic logic gate;
   a control signal input for receiving a control signal having edges substantially synchronous with edges of said clock signal and a control voltage swing between an asserted voltage state substantially equal to said voltage of said first power supply rail and a de-asserted voltage state substantially differing from said voltage of said second power supply rail in a direction of said first power supply rail;
   a dynamic logic tree for discharging said summing node in response to a predetermined states of one or more logical input signals connected to inputs of said dynamic logic tree;
   a pre-charge circuit connected to said summing node and a second power supply rail for setting said summing node to a pre-charge voltage level corresponding to a second logical state opposite from said first logical state, said pre-charge circuit having an input connected to said control signal, whereby said summing node is held in said second logical state while said control signal is de-asserted and retained in said second logical state until altered by conduction through said dynamic logic tree due to predetermined states of said one or more logical input signals; and
   an inverter having an input coupled to said summing node and an output providing an output signal of said dynamic logic gate.

2. The dynamic logic gate of claim 1, wherein said dynamic logic tree comprises one or more transistor ladders comprising transistors having series connected channels coupled between a summing node and a first power supply rail corresponding to a first logical state, and wherein gates of said transistors are connected to said one or more logical input signals.

3. The dynamic logic gate of claim 1, wherein said de-asserted voltage level differs from a voltage of said second power supply rail by more than ten percent of the absolute difference between said first and second power supply rails.

4. The dynamic logic gate of claim 1, wherein said de-asserted voltage level differs from a voltage of said second power supply rail by a value between ten and twenty percent of the absolute difference between said first and second power supply rails.

5. The dynamic logic gate of claim 1, wherein said pre-charge circuit comprises a transistor having a gate connected to said control signal, a first channel connection connected to said second power supply rail and a second channel connection connected to said summing node.

6. The dynamic logic gate of claim 1, further comprising a foot transistor having a gate connected to said clock signal input, a first channel connection connected to said first power supply rail and a second channel connected to said dynamic logic tree for isolating said dynamic logic tree from said first power supply rail when said clock signal is substantially equal to said voltage of said first power supply rail.

7. The dynamic logic gate of claim 1, further comprising another inverter having an input connected to said summing node and an output connected to an input of said inverter, whereby said inverter is coupled to said summing node by said another inverter, and wherein said another inverter includes a foot transistor having a gate connected to said clock signal, a first channel connection connected to said first power supply rail and a second channel connection connected to other device of said another inverter for preventing conduction through said inverter when said clock signal is in said voltage state substantially equal to said first power supply rail.

8. The dynamic logic gate of claim 7, wherein said another inverter further comprises a second foot transistor having a gate connected to said output of said dynamic logic gate, whereby said another inverter is enabled when said output of said dynamic logic gate is in said voltage state corresponding to said second power supply rail.

9. The dynamic logic gate of claim 7, further comprising a pull-up circuit connected to said output of said another inverter and having an input connected to said clock signal for pulling up said output of said another inverter when said clock signal is in said voltage state corresponding to said first power supply rail.

10. The dynamic logic gate of claim 9, wherein said pull-up circuit comprises:
   a first pull-up transistor having a gate connected to said clock signal; and
   a second pull-up transistor having a gate connected to said output of said dynamic logic gate, and wherein said first and second pull-up transistors are series-connected between said second power supply rail and said output of said another inverter.

11. A method of operating a dynamic logical circuit, comprising:
   responsive to a control signal, pre-charging a summing node of said dynamic logical circuit to a predetermined first power supply rail voltage by supplying a current through a pre-charge circuit;
   responsive to a plurality of logical signal inputs assuming a predetermined combination of logical values, discharging said summing node after completion of said pre-charging to a predetermined second power supply rail voltage;
   continuing to supply current during said discharging, at a level limited below that of said current supplied during said pre-charging, to said summing node through said pre-charge circuit to maintain said summing node at a level corresponding to said predetermined first power supply rail voltage unless said discharging has been performed; and
   providing a logical output corresponding to a value of said summing node, wherein said control signal has a voltage swing extending substantially from an asserted voltage substantially equal to said second power supply rail voltage to a de-asserted voltage substantially differing from said first power supply rail voltage, and wherein said continuing to supply current during said discharging supplies a current having a level controlled and limited by a value of said de-asserted voltage.

12. The method of claim 11, wherein said de-asserted voltage level differs from a voltage of said first power supply rail by more than ten percent of the absolute difference between said first and second power supply rails.

13. The method of claim 12, wherein said de-asserted voltage level differs from a voltage of said first power supply rail by a value between ten and twenty percent of the absolute difference between said first and second power supply rails.

14. The method of claim 11, wherein said providing provides said logical output through an inverter having an input connected to said summing node, wherein said inverter has a foot device for isolating said inverter logic tree from said first power supply rail, and wherein said method further comprises disabling said inverter foot device in response to a clock signal having a voltage swing substantially extending from a voltage equal to a voltage of said first power supply rail to a voltage equal to a voltage of said second power supply rail.

15. The method of claim 14, further comprising pulling up an output of said inverter in response to said clock signal assuming a voltage state corresponding to said second power supply rail.

16. The method of claim 11, wherein said discharging is performed through a logic ladder for conducting current when said plurality of logical signal inputs assumes said predetermined combination of logical values, and wherein said method further comprises selectively isolating said logic ladder from said second power supply rail in response to a clock signal having a voltage swing substantially extending from a voltage equal to a voltage of said first power supply rail to a voltage equal to a voltage of said second power supply rail.

17. An integrated circuit comprising:
   a plurality of dynamic logic circuits each having a clock input for controlling evaluation at a summing node, a control input for controlling pre-charging of the summing node and a plurality of logic inputs for determining whether or not said evaluation in response to said clock changes a logical state of said summing node; and
   a local clock buffer having a clock output connected to said clock input of each of at least a portion of said plurality of dynamic logic circuits, and a control output connected to said control input of each of at least a portion of said plurality of dynamic logic circuits, and wherein said local clock buffer includes a control generator circuit for generating a control signal on said control output, said control signal having a first voltage state substantially equal to a voltage of a first power supply rail of said plurality of dynamic circuits that corresponds to an evaluate state of said plurality of dynamic circuits and a second voltage state substantially differing from a voltage of a second power supply rail of said plurality of dynamic circuits, whereby said control input causes a limited amount of pre-charge current to continue to flow during said evaluation to eliminate changes in said summing node due to leakage, noise and charge sharing in input device ladders connected to said summing node.

18. The integrated circuit of claim 17, wherein said local clock buffer further includes a clock generator for generating a clock signal at said clock output, said clock signal having a voltage swing extending between two voltage substantially equal to said voltages of said power supply rails of said plurality of dynamic logical circuits.

19. The integrated circuit of claim 17, wherein said second voltage state of said control signal differs from said voltage of said second power supply rail by more than ten percent in the direction of said first power supply rail, and wherein said local clock buffer has a power supply input for receiving a power supply voltage substantially equal to said second voltage state of said control signal for generating said control signal.

* * * * *